United States Patent [19]
Tachihara et al.

[11] Patent Number: 5,664,251
[45] Date of Patent: Sep. 2, 1997

[54] METHOD OF MAKING AN APERTURE PLATE FOR A MULTIBEAM PATTERN DRAWING APPARATUS

[75] Inventors: Satoru Tachihara; Koichi Maruyama; Tetsuya Nakamura; Takashi Okuyama; Tamihiro Miyoshi; Shinichi Suzuki, all of Tokyo, Japan

[73] Assignee: Asahi Kogaku Kogyo Kabushiki Kaisha, Tokyo, Japan

[21] Appl. No.: 648,705

[22] Filed: May 16, 1996

[30] Foreign Application Priority Data

May 17, 1995 [JP] Japan ................................. 7-142746

[51] Int. Cl.⁶ ........................ G03B 41/00; B41J 2/447
[52] U.S. Cl. ........................ 396/548; 347/241
[58] Field of Search ........................ 396/548, 549; 347/241, 243, 244, 251, 256, 258, 259, 260, 261, 230

[56] References Cited

U.S. PATENT DOCUMENTS 3,984,845  10/1976  Tashiro et al. .
4,003,061   1/1977  LaCanfora ........................ 396/548
4,416,522  11/1983  Webster ........................... 396/548
4,518,859   5/1985  Hoshika .
4,841,316   6/1989  Payone et al. .................... 396/548
5,539,444   7/1996  Ikeda et al. ..................... 347/241

FOREIGN PATENT DOCUMENTS

6-186490  7/1994  Japan .

*Primary Examiner*—Alan A. Mathews
*Attorney, Agent, or Firm*—Greenblum & Bernstein P.L.C.

[57] ABSTRACT

For an aperture plate to be used to form dot images of a two dimensional aperture pattern by projection through an imaging optical system in a normal direction, a pattern of markings in ideal positions is projected through an imaging optical system in the reverse direction to normal imaging operations. The image of the pattern is recorded at the position of the aperture plate, and the recorded image is used as a guide to form corrected apertures in the aperture plate. Accordingly, locational errors of the dot images in the normal direction are corrected when the corrected aperture plate is used.

8 Claims, 8 Drawing Sheets

METHOD OF MAKING AN APERTURE PLATE FOR A MULTIBEAM PATTERN DRAWING APPARATUS

BACKGROUND OF THE INVENTION

The present invention relates to a process for manufacturing an aperture plate used in a multibeam pattern drawing apparatus including multiple light sources.

Conventionally, photo plotters for drawing accurate patterns (for example, printed substrate circuits) include a laser light source and a deflecting device for scanning the laser light along a main scanning direction onto an object. Usually, the deflecting device is a rotating or oscillating mirror. The object is moved in an auxiliary scanning direction perpendicular to the main scanning direction. A two dimensional pattern is drawn from the main and auxiliary scanning.

However, since the conventional laser photo plotter employs a rotating or a oscillating mirror, the laser beam is scanned along the main scanning direction at a high speed, and it is difficult to increase the accuracy of the beam registration. Furthermore, when a semiconductor laser is used as the laser source, optical components to correct astigmatism and a high speed driving circuit (to accurately modulate the scanning laser beam) are required. Still further, with a semiconductor laser, a large amount of heat is developed.

SUMMARY OF THE INVENTION

It is therefore an object of the present invention to provide an improved process for manufacturing an aperture plate for use in a multibeam pattern drawing device that aids in high speed, accurate patterning.

According to one aspect of the present invention, a method for forming an aperture plate for use in a pattern drawing device, in which dot images of light transmitted through apertures in the aperture plate are formed on an image surface in a forward direction through an imaging optical system, satisfies this object. The method includes: arranging a master chart at a first position corresponding to the position of the image surface, the master chart having a pattern of master dot markings that correspond to ideal dot image locations; illuminating the master chart to form guide images of the master dot markings in a reverse direction through the imaging optical system, at a second position corresponding to the position of the aperture plate; recording the guide images of the master dot markings; and forming corrected apertures in the aperture plate at locations of the guide images of the master dot markings, the corrected apertures forming dot images at the ideal dot image locations when light is transmitted through the corrected apertures from the second position through the imaging optical system in the forward direction to the first position.

In this manner, since the guide images of the master dot markings include the reverse locational errors of the imaging optical system when formed at the second position, when an aperture plate is made according to the guide images, the locational errors caused by the optical system are corrected when the dot images are projected in the normal direction. Thus, the aperture plate manufactured by this method cancels the location error of the dot images due to distortion caused by optical and mechanical errors, by forming an aperture plate that takes into account the error of the imaging optical system.

Preferably, the step of recording includes: arranging a photosensitive material at the second position; and copying the guide images of the master dot markings onto the photosensitive material. Further preferably, the master chart includes master dot markings corresponding to every corrected aperture to be formed in the aperture plate.

According to another aspect of the invention, a method for forming an aperture plate, for the purpose noted above, includes: arranging a single master dot marking at a first position corresponding to the position of the image surface; illuminating the single master dot marking to form a guide image of the single master dot marking in a reverse direction through the imaging optical system, at a second position corresponding to the position of the aperture plate; recording the guide image of the single master dot marking; changing a relative position between the single master dot marking and the imaging optical system, the amount of the relative position change being calculated from locational relationships between ideal dot image locations; repeating the recording and the changing until guide images of the single master dot marking are recorded for ideal dot image locations corresponding to a predetermined pattern; and forming corrected apertures in the aperture plate at recorded locations of the guide images of the single master dot marking, the corrected apertures forming dot images at the ideal dot image locations when light is transmitted through the corrected apertures from the second position through the imaging optical system in the forward direction to the first position.

Again, since the guide images of the master dot marking, having been recorded at the various positions, includes the reverse location errors of the imaging optical system when formed at the second position, when an aperture plate is made according to the guide images, the location errors caused by the optical system are corrected when the dot images are projected in the normal direction. Thus, the aperture plate manufactured by this method cancels the location error of the dot images due to distortion caused by optical and mechanical errors, by forming an aperture plate that takes into account the error of the imaging optical system. Furthermore, it is not necessary to form an accurate master dot pattern in order to create the guide images.

According to still another aspect of the invention, a method for forming an aperture plate, for the purpose noted above, includes: arranging a mater chart at a first position corresponding to the position of the image surface, the master chart having a pattern that corresponds to a locationally correct image; illuminating the master chart to form a guide image in a reverse direction through the imaging optical system, at a second position corresponding to the position of the aperture plate; recording the guide image; and forming corrected apertures in the aperture plate at locations determined by the guide image, the corrected apertures forming locationally correct dot images when light is transmitted through the corrected apertures from the second position through the imaging optical system in the forward direction to the first position.

In this case, since the guide image includes the reverse location error of the imaging optical system when formed at the second position, when an aperture plate is made according to the guide image, the location errors caused by the optical system are corrected when the dot images are projected in the normal direction. Thus, the aperture plate manufactured by this method cancels the location error of the dot images due to distortion caused by optical and mechanical errors, by forming an aperture plate that takes into account the error of the imaging optical system.

Yet another aspect of the invention involves a method for forming an aperture plate for use in a pattern drawing device in which dot images of light transmitted through apertures in the aperture plate are formed on an image surface in a forward direction through an imaging optical system. The method includes: arranging a reference grid pattern at a second position corresponding to the position of the aperture plate; illuminating the reference grid pattern to form a grid guide image in the forward direction through the imaging optical system, at a first position corresponding to the position of the image surface; recording the grid guide image; and forming corrected apertures in the aperture plate at locations determined by the grid guide image by comparing the reference grid pattern and the grid guide image to determine the corrected aperture locations, the corrected apertures forming locationally correct dot images when light is transmitted through the corrected apertures from the second position through the imaging optical system in the forward direction to the first position.

DETAILED DESCRIPTION OF THE PREFERRED EMBODIMENTS

Figure 1:
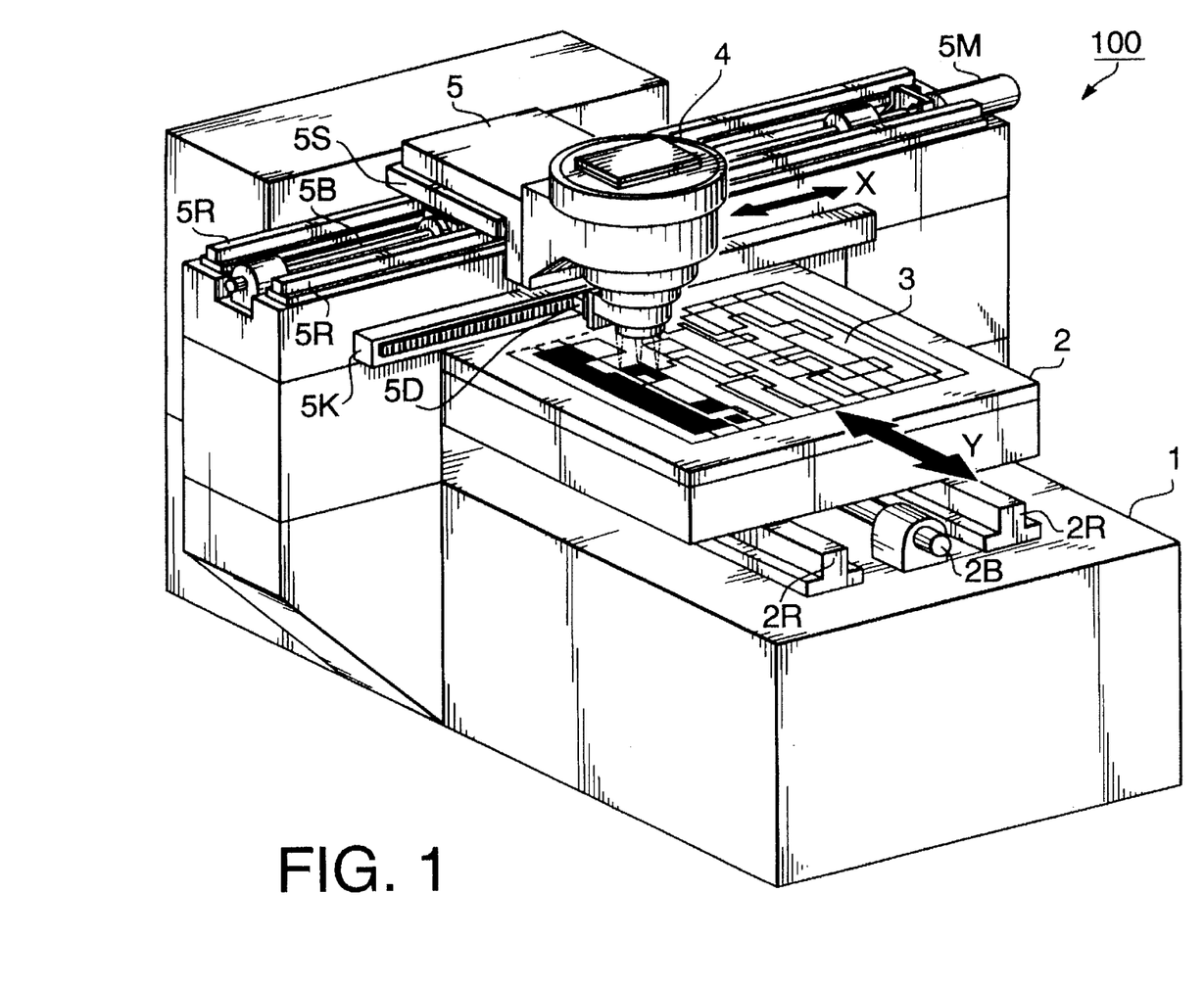
FIG. 1 is a perspective view of a multibeam pattern drawing apparatus to which an embodiment of an aperture plate manufactured according to the present invention is applied.

FIG. 1 is a perspective view of a multibeam pattern drawing apparatus 100 in which an aperture plate 43 according to the embodiments of the invention is employed. The apparatus 100 draws a circuit pattern on a mask, and the mask is used to expose the pattern onto a photosensitive material on a substrate.

The apparatus 100 comprises a base 1 supporting a movable table 2. A photosensitive film 3 is carried on the table 2. The table 2 is supported by a pair of guide rails 2R, 2R extending in a Y direction (shown by an arrow Y) and is moved along the Y direction when a screw rod 2B is rotated by a table drive motor (not shown).

A light emitting unit 4 emits drawing light beams in a two dimensional pattern. The light emitting unit 4 is fixed to an optical base portion 5 set on an optical system transport stage 5S. The optical base portion 5 is guided by a pair of guide rails 5R and 5R extending in an X direction (shown by an arrow X) and is moved along X direction when a screw rod 5B is rotated by a optical system driving motor 5M. The light emitting unit 4 moves together with the optical base portion 5.

The base 1 is provided with an X-direction linear scale 5K extending along the X direction. The light emitting unit 4 has an X-direction scale detector head 5D that reads position information from the X-direction linear scale 5K to detect the position of the light emitting unit 4. The optical system driving motor 5M is controlled by applying feedback from the X-direction scale detector head 5D. The base 1 is similarly provided with a Y-direction linear scale (not shown) that extends along the Y direction, while the table 2 has a Y-direction scale detector head (not shown), for similarly controlling the table drive motor (not shown).

Figure 2:
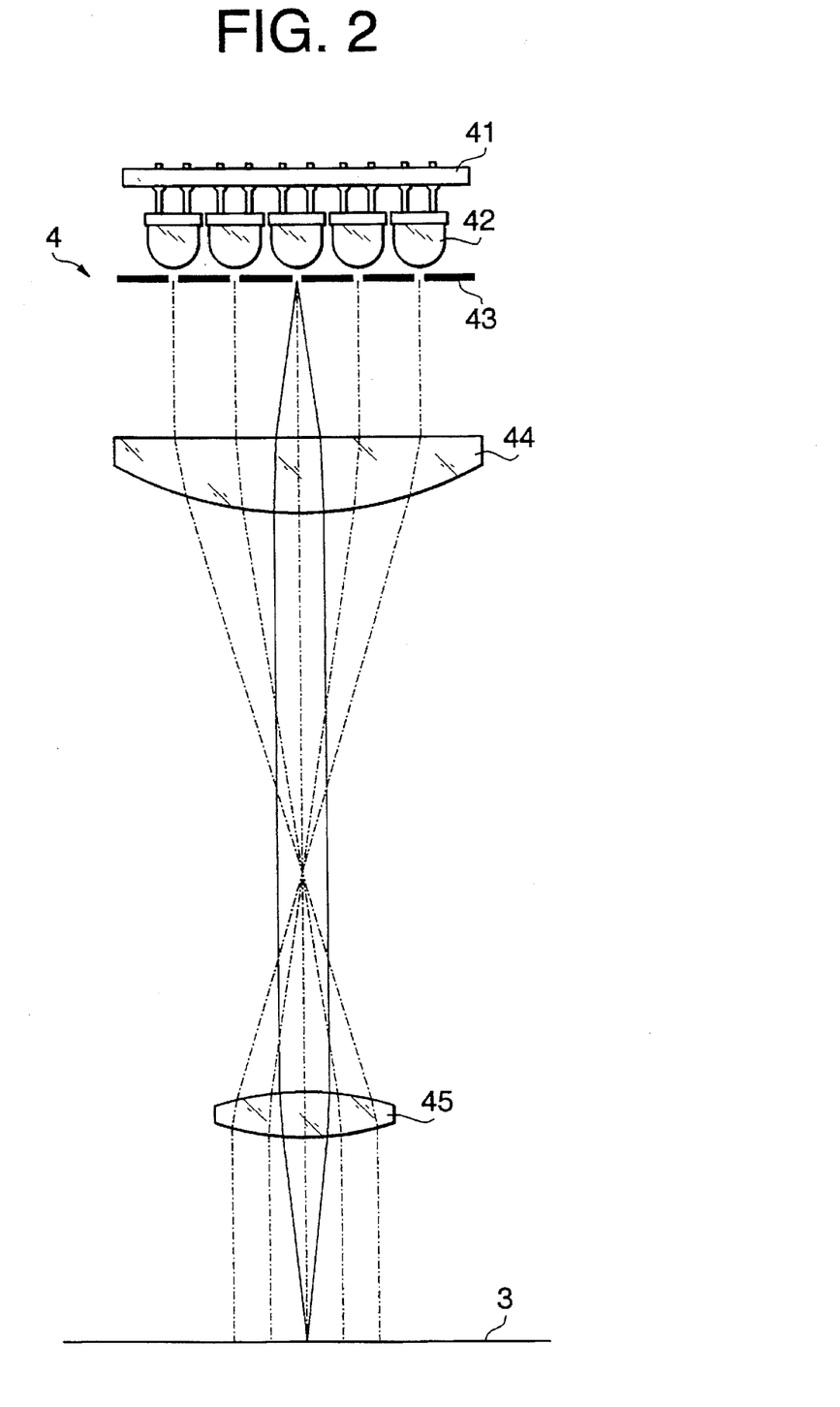
FIG. 2 is a schematic view of an optical system of the apparatus of FIG. 1.

FIG. 2 shows the construction of the optical system of the light emitting unit 4. The light emitting unit 4 comprises a light emitting diose (LED) array that is formed of a multiplicity of LED's 42 attached to a substrate 41, an aperture plate 43 having a multiplicity of apertures 43A, each corresponding to one of the LED's 42, and a reducing optical system including of a first lens group 44 and a second lens group 45. The light emitted from the LED's 42 passes through the apertures 43A in the aperture plate 43, and is projected by the reducing optical system onto the photosensitive film 3. The images of the apertures 43A are formed on the photosensitive film 3. The aperture plate 43 and photosensitive film 3 are arranged at optically conjugate positions with respect to the reducing optical system.

The photosensitive film 3 is, for example, an orthochromatic plate having a spectral sensitivity in the range 400 nm to 570 nm wavelength. The LED's 42 are, for example, blue light emitting diodes having a peak wavelength of 450 nm.

An apparatus for drawing a circuit pattern on a print substrate must have accurate drawing characteristics and high resolution. In order to obtain high resolution, both the diameter of the dot images and the pitch between dot images should be small. A problem exists in that when a linear LED array is used as the light source, the pitch of the light emitting points in a row can be no smaller than the actual size of each LED element.

However, in the aperture plate 43 as manufactured by the embodiments of the present invention, the multiplicity of apertures 43A are formed in the aperture plate 43 in a staggered two dimensional array having a number of evenly spaced rows R in the Y direction, and a number of inclined columns C, each angled from the Y direction by the same amount and evenly spaced from each other. In this example, each of the LED's 42 is of, for example, 3.8 mm diameter in the plane of the substrate 41. Since the apertures 43A are formed at locations corresponding to those of the LED's 42, the dot images are formed discretely on the photosensitive film 3.

Figure 3:
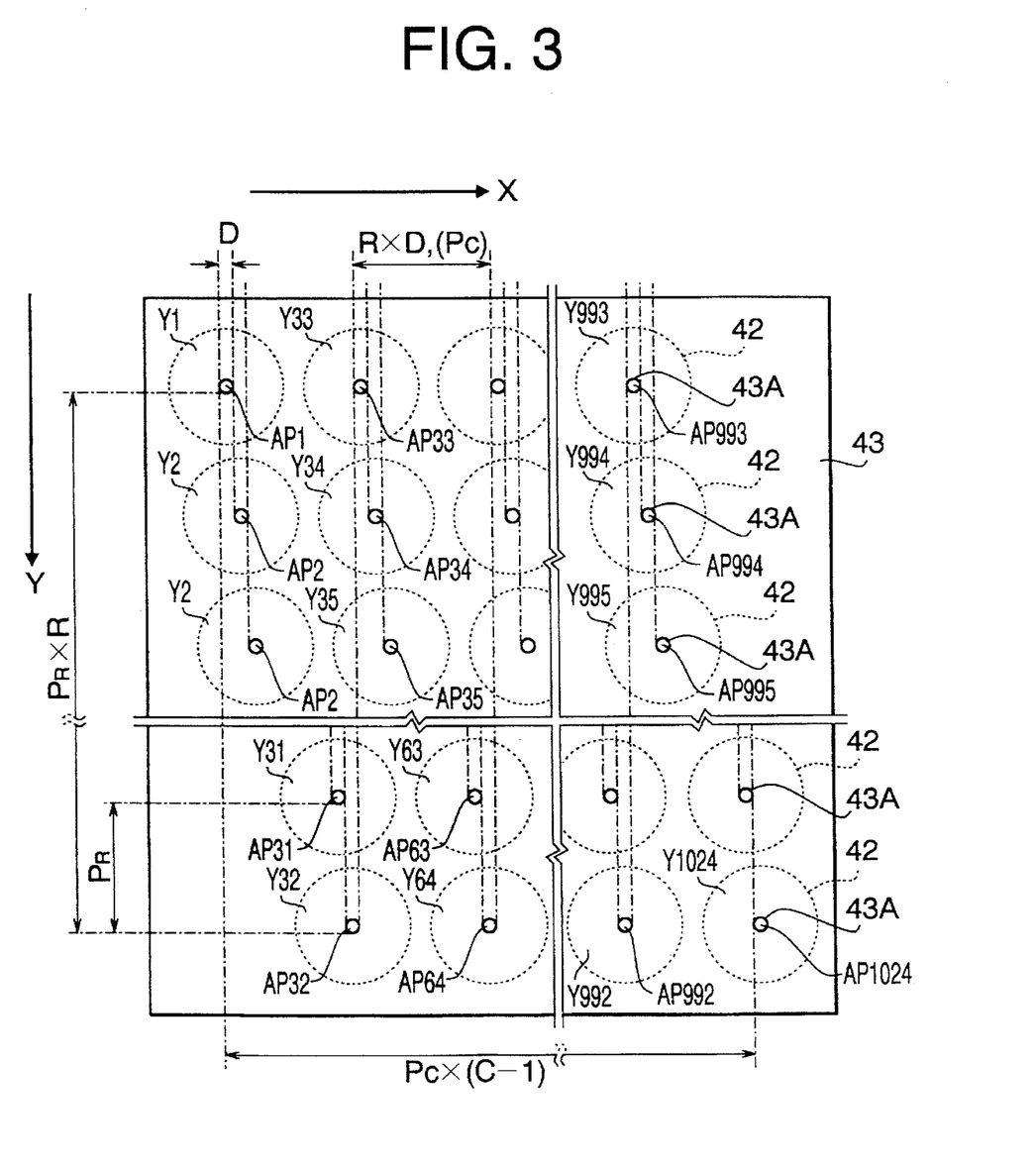
FIG. 3 is a top view of the aperture plate when viewed from a light emitting unit side.

FIG. 3 is a top view of the aperture plate 43, viewed from the side of the LED's 42. In this example, there are 32 parallel rows, and 32 parallel angled columns of apertures 43A. The LED's 42 (shown by phantom lines in FIG. 3) are arranged in a staggered two dimensional pattern corresponding to that of the apertures 43A. As shown in FIG. 3, the apertures 43A are of a diameter D (for example, of 0.125 mm diameter), and are arranged in evenly separated rows separated by a distance hereinafter referred to as inter-row pitch $P_R$. Within each row, the apertures 43A are evenly separated by an interval, hereinafter referred to as inter-column pitch $P_C$, equal to the number of rows R times the diameter D of the apertures 43A (for example, 32 rows× 0.125 mm=4 mm). Each row is staggered from the previous row in the X direction by an amount corresponding to the diameter D of the apertures 43A, giving the angled column.

Accordingly, the right hand side tangential line in the Y direction of each aperture 43A is collinear with the left hand side tangential line in the Y direction of the aperture 43A in the following row. Similarly, since the inter-column pitch $P_C$ is determined based upon the aperture diameter D and the number of rows R, the right hand side tangential line in the Y direction of each aperture 43a in the last row is collinear with the aperture 43A in the following angled column of the first row, 31 rows above.

The locations of the LED's 42 are labeled $Y_n$, n being from 1 to 1024, from the first row and first angled column, along the columns from top to bottom. That is, in this example having 32 rows and 32 angled columns, the LED's 42 in the first angled column are labeled by $Y_1, Y_2, Y_3$–$Y_{32}$, those in the second angled column are labeled by $Y_{33}, Y_{34}, Y_{35}$–$Y_{64}$, and continuing on to the 32nd and last angled column, labeled by $Y_{993}, Y_{994}, Y_{995}$–$Y_{1024}$. As noted, in each row, the columnar location of the LED's 42 are shifted in the X direction from the LED's 42 of the previous row by the diameter D of the apertures 43A.

Similarly to the LED's 42, the locations of the apertures 43A are labeled as $AP_n$, n being from 1 to 1024, from the first row and first angled column, along the columns from top to bottom. That is, in this example having 32 rows and 32 angled columns, the apertures 43A in the first angled column are labeled by $AP_1, AP_2, AP_3$–$AP_{32}$, those in the second angled column are labeled by $AP_{33}, AP_{34}, AP_{35}$–$AP_{64}$, and continuing on to the 32nd and last column, labeled by $AP_{993}, AP_{994}, AP_{995}$–$AP_{1024}$. As noted, in each row, the columnar location of the apertures 43A are shifted in the X direction from the apertures 43A of the previous row by the diameter D of the apertures 43A.

As noted, in this example, the diameter D of the apertures 43A is 0.125 mm, and 32 LED's 42 are arranged in each angled column (i.e., there are 32 rows). Accordingly, the inter-column pitch $P_C$ is 4 mm, that is, R×D, or 32 rows× 0.125 mm aperture diameter. Furthermore, in this example, the displacement in the X direction from the aperture $AP_1$ in the first row of the first angled column to the aperture $AP_{1024}$ on the 32nd (last) row of the 32nd (last) angled column is 124 mm, that is, (C−1)×(R×D), or 31 inter-column pitch intervals×4 mm inter-column pitch $P_C$.

Figure 4:
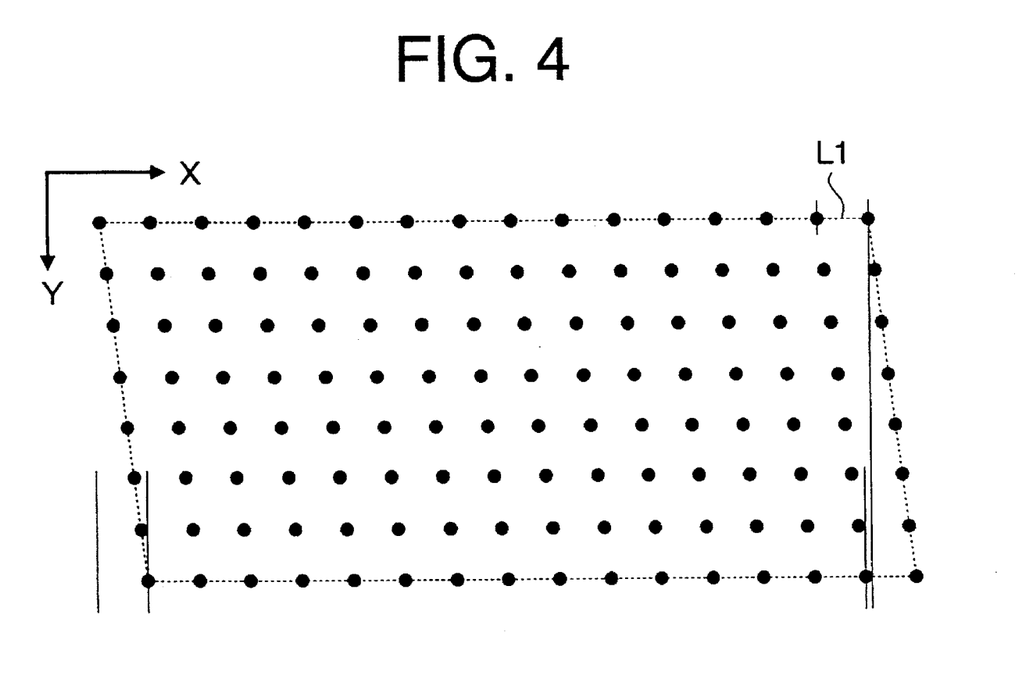
FIG. 4 shows a pattern of dot images formed on a photosensitive film by apertures in the aperture plate.
Figure 5:
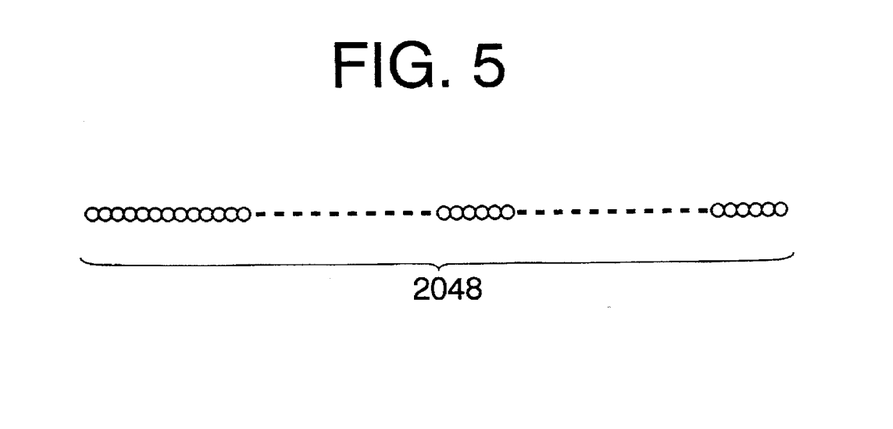
FIG. 5 shows a line image formed as an array of 1024 dot images.

FIG. 4 shows a schematic pattern of the dot images of the apertures 43A formed on the photosensitive film 3 when all of the LED's 42 emit a light beam. When the LED's 42 are selectively controlled to be ON or OFF, the pattern is formed from dot images (ON) and spaces (OFF). Although the pattern in FIG. 4 shows only 8 rows before the right tangential sides of the last row of dot images is aligned with the left tangential sides of the first row of dot images, the operation is analogous to the 32-row system of the example. The light emission of the LED's 42 in the array and the movement of the table 2 are synchronized to be able to form 1024 dot images in a continuous line, the pattern of dot images at locations within the line depending on which LED's 42 are ON or OFF. The dot image locations along the line have a pitch equal to the dot image diameter (i.e., all dot image locations in the line tangential to the next), as shown in FIG. 5. The dot image diameter is determined by the magnification of the imaging optical system and the aperture diameter D.

To form a continuous line, light beams from the LED's 42 in the first row of LED locations (in this example, $Y_1, Y_{33}, Y_{65}$–$Y_{993}$) separated by the aforementioned inter-column pitch $P_C$ form discrete dot images (when ON) at locations aligned in a line L1 on the film 3. This line L1 is depicted in FIG. 4. Subsequently, the table 2 transfers the film 3 in the Y direction by an amount determined by the inter-row pitch $P_R$ and the magnification of the imaging optical system, so that the dot image formed by the light from the LED's 42 (when ON) in the second row of LED Locations (in this example, $Y_2, Y_{34}, Y_{66}$–$Y_{994}$) will coincide with the line L1.

For example, when the reducing magnification of the imaging optical system is 25:1, the diameter of each dot image is 1/25 of the diameter D of the apertures 43A, and the table must be transferred in the Y direction by 1/25 of the inter-row pitch $P_R$. After this movement, since the second row of apertures 43A, having the same inter-column pitch $P_C$ as the first row, is displaced from the first row of apertures 43A in the X direction by the aperture diameter D, the light beams from the LED's 42 in the second row form discrete dot images adjacent and tangential to the dot image locations of the dot images previously formed by the LED's 42 in the first row. This procedure is repeated for all the rows.

As noted, since the inter-column pitch $P_C$ is determined by the aperture diameter D and the number of rows, LED's 42 in the last row that are ON form discrete dot images that are adjacent and tangential on one side (in the X direction) to the previous row of dot image locations, and adjacent and tangential on the opposite side to the first row of dot image locations. Accordingly, when the table 2 and the LED's 42 of each of the rows are controlled until the LED's 42 of the last row are driven, a line image is formed as a collection of all the dot images of LED's that are ON (in this case, the selectively controlled dot images at 1024 adjacent locations), as shown in FIG. 5.

It should be noted that as the same time as the second row of LED's 42 is forming the second set of dot images of the line image for the first line L1, the first row of LED's can form the first set of dot images of a line image for a second line adjacent to the first. In this case, subsequently, the third row forms the third set of dot images for the first line L1, the second row forms the second set of dot images for the second line, and the first row forms the first set of row images for a third line adjacent to the second line, and so on.

As the table is driven in a pass along the Y direction and the line images are formed in this manner, a band-like pattern portion is formed from the successive lines, the band-like pattern portion being as wide as the lines (in this case, 124 nm and 1024 dot images wide). When the light emitting unit 4 completes a pass scanning from one terminus to the opposite terminus of a pattern on the film 3 as the table moves along the Y direction, the first pass is complete, the first band-like pattern portion of the complete pattern is formed, and the table is stopped. The optical system transport stage 5S is moved in the X direction by the width of one band-like pattern portion (in the given example, by 124 mm). Then, the table 2 is started to move in the reverse direction along the Y direction for a second pass.

In reverse, the LED's 42 are controlled such that the last row of LED's forms the first set of dot images of the first line image in the reverse direction, followed by the second-last row, and so on. Thus, a second band-like pattern portion of the pattern is formed adjacent to the first in a second pass. When the second pass is complete, and the second band-like pattern portion of the pattern is formed in the reverse direction, the system transport stage is moved in the X direction by the width of the band-like pattern portion again, and a subsequent pass for forming a subsequent (third)

band-like pattern portion is formed in the forward direction as previously described.

The process is repeated until a complete pattern is formed from the sequential passes, imaging the adjacent band-like pattern portions in a row to form the complete pattern. The moving amount of the optical system transport stage 5S in the X direction between adjacent band-like pattern portions is controlled so as not to produce overlap or space between the adjacent band-like pattern portions, and to form a complete pattern made of the sequential band-like pattern portions.

Figure 6:
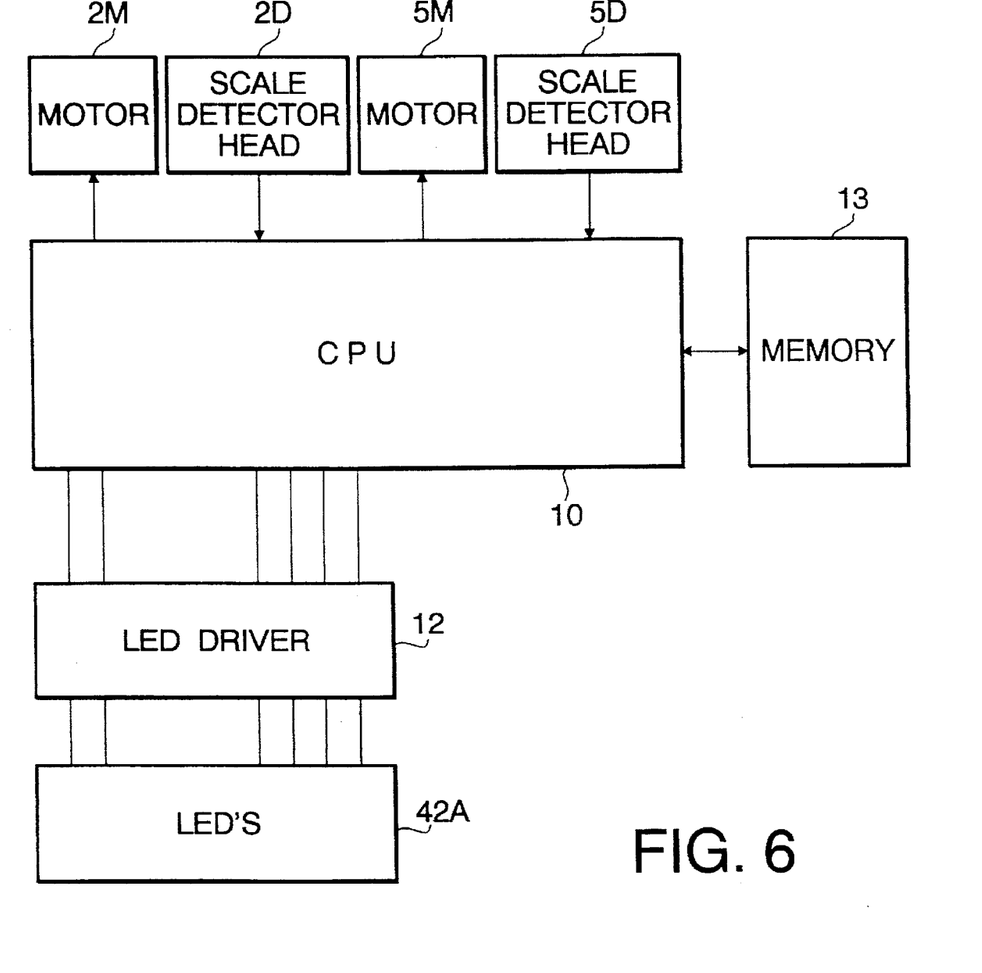
FIG. 6 is a block diagram of a control system of the apparatus of FIG. 1.

FIG. 6 is a block diagram of the controlling system of the apparatus 100. A central processing unit (CPU) 10 transfers drawing data that is stored therein as a bitmap in a memory 13 to an LED driver 12, synchronized by a predetermined clock signal. The LED driver 12 drives the LED's 42 by applying pulse currents at a predetermined voltage to illuminate the LED's 42.

The CPU 10 also controls the movements of the table 2 and the optical system transport stage 5S. In the apparatus 100 of this embodiment, the CPU 10 controls an optical system driving motor 5M to locate the light emitting unit 4, mounted on the optical base 5, in the X direction. The CPU 10 then controls the LED driver 12 and the table driving motor 2M to selectively illuminate the LED's 42 while the table 2 moves in the Y direction. The movements of the optical system carrying stage 5S and the table 2 are monitored according to the scale detection heads 5D and 2D. That is, the CPU 10 controls the motors 5M and 2M based on feedback signals from the scale detector heads 5D and 2D.

In order to draw an accurate pattern, the locational relationship between the apertures 43A must be accurate. In general, however, since any imaging optical system introduces distortion, location error of the dot images results even if the apertures 43A are formed accurately. For instance, when the diameter of the apertures 43A is 0.125 mm, and the pitch of the apertures is 0.25 mm, the entire zone formed by the 1024 LED's is 124 mm by 124 mm. This zone is imaged by the imaging optical system on the film 3 as a reduced image. When the magnification (reduction) of the imaging optical system is 1/25, the imaged zone is 5 mm by 5 mm.

If the imaging optical system has, for example, a maximum distortion of 1%, the location error of the dot image of the aperture 43A in the location $AP_1$ is $-0.025$ mm in the X direction and $0.025$ mm in the Y direction. In the same manner, the location error of the dot image of the aperture 43A in the location $AP_{1024}$ is $0.025$ mm in the X direction and $-0.025$ mm in the Y direction. Since the diameter of a single dot image for this imaging optical system is 0.010 mm, the location error becomes 2.5 dots, which is unacceptable.

Furthermore, location error of the dot images gives rises to a more serious problem when the pattern is formed from a plurality of band-like pattern portions. In this case, when the distortion reduces the distance between the dot images of the apertures 43A at locations $AP_1$ and $AP_{1024}$, an unpatterned area is formed between the adjacent band-like pattern portions. If the distortion expands the distance, the adjacent band-like pattern portions overlap each other.

An optical system may be designed to correct aberrations by increasing the number of lens elements. However, increasing of the lens elements raises the cost and size of the optical system, and reduces the transmittance. Further, if the optical aberrations are corrected by lens design, distortions remain due to manufacturing or assembling errors of the lenses and/or the lens barrel.

In an apparatus having an aperture plate 43 to which the methods of the present invention is applied, the dot images are in an accurate location even when the optical system has distortion.

Figure 7A:
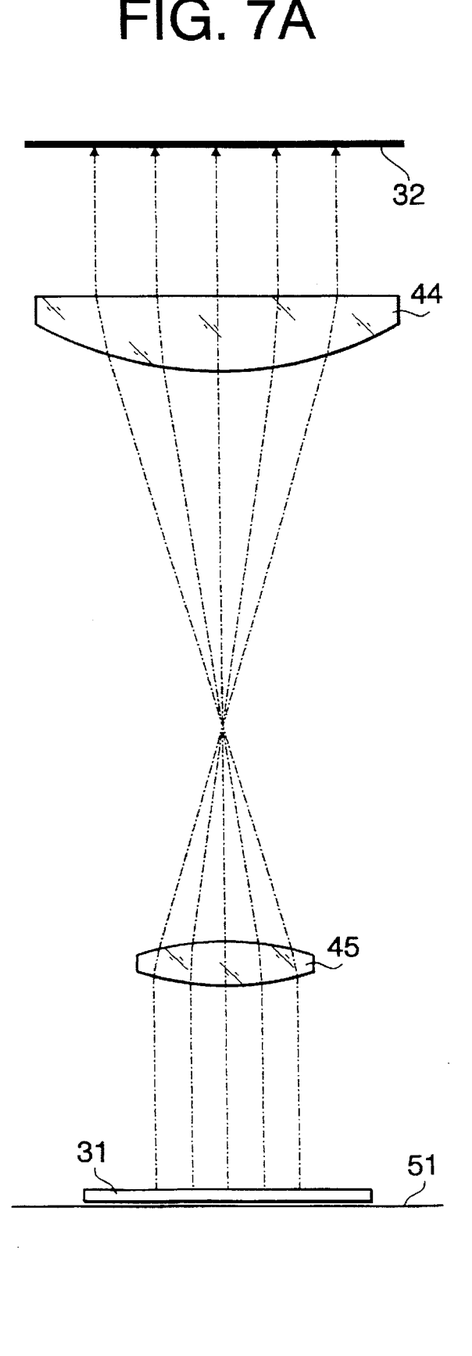
FIG. 7A shows a first embodiment of a method of making the aperture plate using a reflection master chart.
Figure 7B:
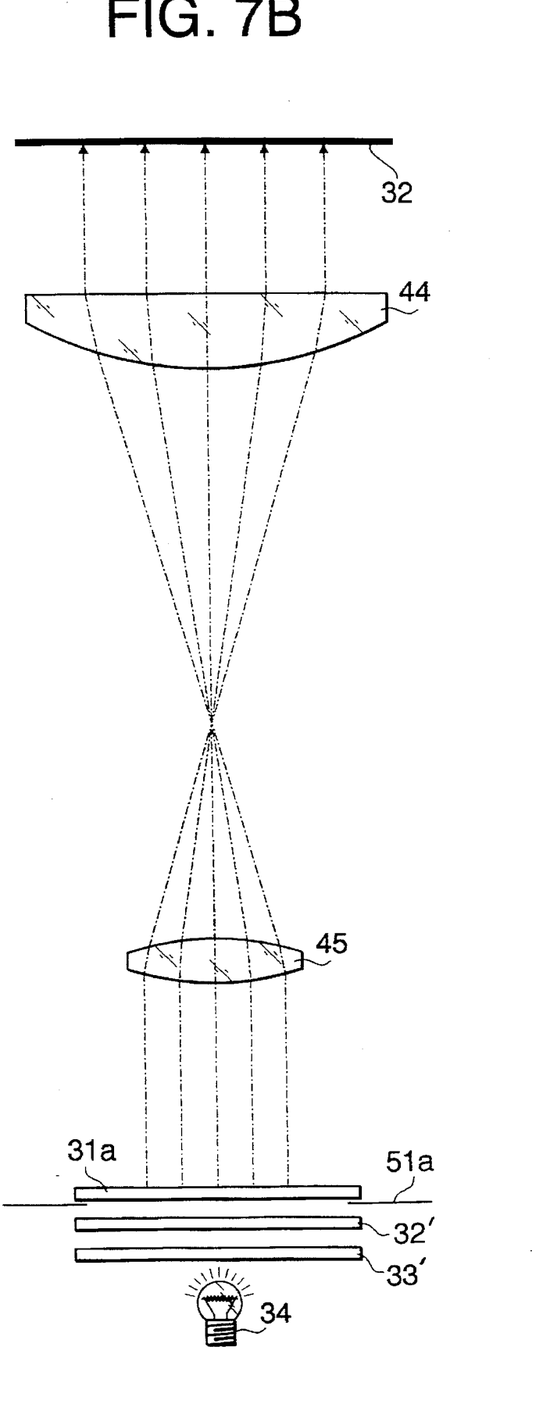
FIG. 7B shows the first embodiment of a method of making the aperture plate using a transmission master chart.

FIGS. 7A and 7B show a first embodiment of a method according to the invention. FIG. 7A shows the method using a reflection master chart 31, and FIG. 7B shows the method using a transmission master chart 31a. In the first embodiment, as shown in FIGS. 7A and 7B, a master chart 31 (or 31a) having a pattern of a plurality of master dot markings is arranged on an image surface 51, the image surface being at the same position (a first position) as the photosensitive film 3 in FIG. 2. The master dot markings are in ideal dot image locations of the apertures 43A, i.e., the master dot markings are in locations corresponding to the locationally correct dot images of the apertures 43 without distortion due to optical and/or mechanical errors.

Subsequently, as shown in FIGS. 7A and 7B, the master chart 31 or 31a is illuminated to project guide images of the master dot markings onto a tracing plate 32. In this method, the light from the master chart 31 progresses through the lenses 45 and 44 in the reverse direction of normal (forward) operation to form the guide images on the tracing plate 32. The tracing plate 32 is positioned at a second position, being the same position as that of the aperture plate 43 in FIG. 2. In the case of a transmission master chart 31a, the image surface 51a allows projection therethrough, and a diffuser 32', filter 33', and light source 34 are provided to generate the projection illumination. The light source 34' and filter 33' combine to project light in the same wavelength range as the LED's 42. The master dot markings are: formed by a laser drawing device on a silver dry plate; formed on a chrome dry plate on which a photoresist is applied by the laser drawing device; or formed on a chrome dry plate on which an electron beam resist is applied by an electron beam recording. The tracing plate 32 is a photosensitive material such as a silver dry plate or a plate with photoresist applied. The pattern recorded on the tracing plate 32 is used for the aperture plate 43 as is, or after the pattern is transformed to a metal (chrome) pattern.

The guide images of the master dot markings are recorded on the tracing plate 32. From the guide images formed and recorded on the tracing plate 32, an aperture plate 43 is formed, the apertures 43A being formed at the corrected aperture locations, i.e., at the same locations as the guide images of the master dot markings are formed on the tracing plate 32. Accordingly, since the guide images of the master dot markings, including the reverse location errors of the imaging optical system, are formed at corrected aperture locations on the tracing plate 32, when an aperture plate 43 is made according to the tracing plate 32, the location errors caused by the imaging optical system are corrected when the dot images are projected in the normal forward direction.

The aperture plate 43 manufactured by this method cancels the location error of the dot images due to distortion caused by optical and mechanical errors by forming an aperture plate 43 that takes into account the error of the imaging optical system. When this aperture plate 43 is used, since the dot images on the film 3 are formed in accurate locations, it allows an accurately drawn pattern to be formed.

Figure 8:
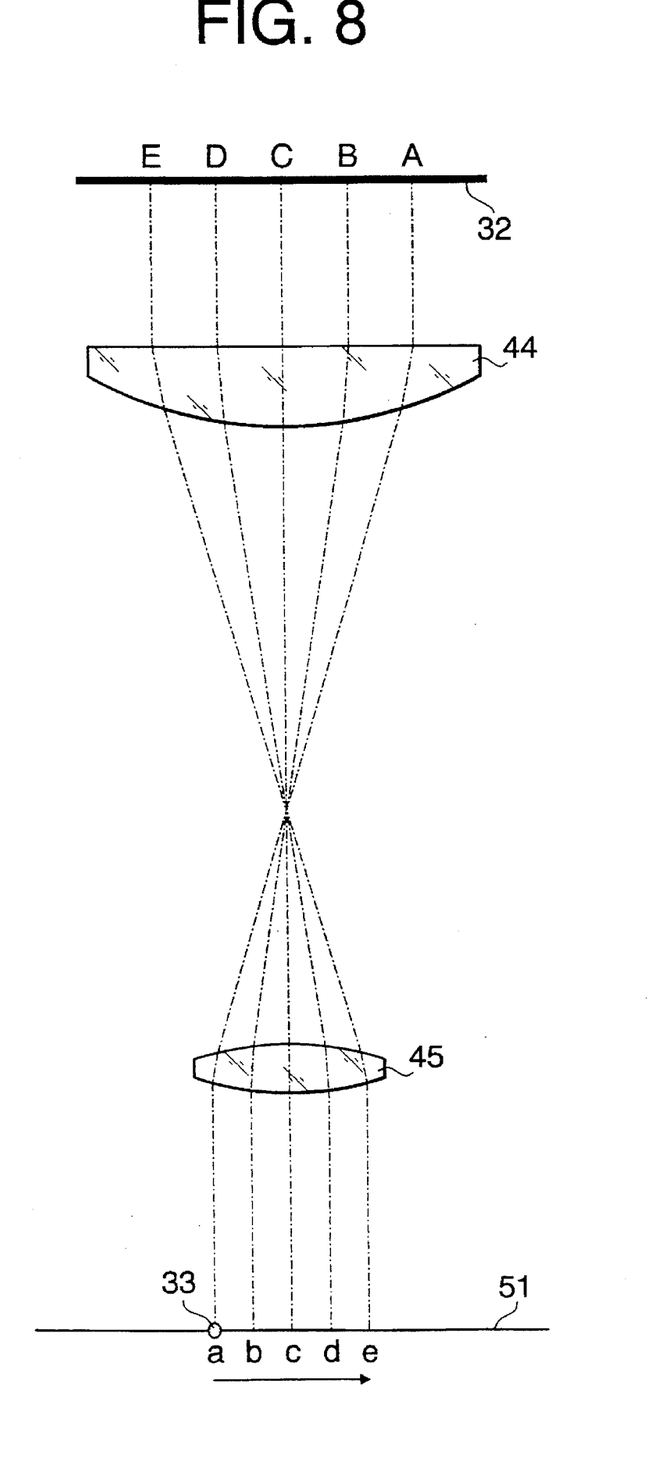
FIG. 8 shows a second embodiment of a method of making the aperture plate.

FIG. 8 shows a second embodiment of a method according to the invention. As shown in FIG. 8, the image surface 51 and tracing plate 32 are substantially similar to the first embodiment. In the second embodiment, a single master dot marking 33 is arranged on the image surface 51. That is, the single master dot marking 33 represents a single dot image. The single master dot marking may be provided as the only marking on a master chart. Furthermore, the second embodiment, as shown, is a reflection type arrangement. However, the single master dot marking 33 may be projected by a diffuser 32', filter 33', and light source 34 identical to that shown in FIG. 7B.

The single master dot marking 33 is illuminated to form a guide image of the master dot marking 33 onto the tracing plate 32 located at the aforementioned first position, corresponding to the position of the aperture plate 43 in FIG. 2. Initially, the table 2 and the stage 5S are set so that the single master dot marking 33 is formed at a predetermined location on the tracing plate 32. For instance, the predetermined location on the tracing plate 32 is set as the aperture location $AP_1$.

Secondly, the table 2 and the stage 5S are controlled so that the master dot marking 33 moves to a location coinciding with the ideal dot image of the next aperture, for example the aperture location $AP_2$. The ideal dot image location is, as in the first embodiment, a location corresponding to the locationally correct dot image of the next aperture 43 without distortion due to optical and/or mechanical errors. The locational relationship between the ideal dot images $AP_1$ and $AP_2$, i.e., the displacement in X and Y directions, is calculated. The calculated result is the moving amount of the table 2 and/or the stage 5S. To illustrate this procedure, for example, if the ideal dot images of the apertures 43A at aperture locations $AP_1$ and $AP_2$ are separated by 0.160 mm in the Y direction and by 0.005 mm in the X direction, the table 2 moves by 0.160 mm and the stage 5S moves by 0.005 mm in order to change the relative location of the master dot marking 33, from the position of an ideal dot image generated by the aperture 43A at the aperture location $AP_1$, to that at the aperture location $AP_2$. The illumination of the single master dot marking 33 progresses through the lenses 45 and 44 in the reverse direction of normal operation, as described for the first embodiment.

In FIG. 8, the locations a, b, c, d and e on the image surface 51 show points at which the master dot marking 33 may be located. When the master dot marking 33 is located at one of these points, the guide image thereof is formed at one of the locations A, B, C, D And E on the tracing plate 32, respectively.

After the table 2 and/or the stage 5S have been moved, the location on the tracing plate 32 at which the guide image of the single master dot marking 33 is formed is recorded as location of the next corrected aperture location. The second step is repeated until the all of the corrected aperture locations are marked on the tracing plate 32.

From this tracing plate 32, an aperture plate 43 is formed so that the apertures 43A are formed at corrected aperture locations where the successively formed guide images of the master dot markings 33 are formed on the tracing plate 32. Accordingly, since the guide images of the master dot marking 33, including the reversed location errors of the imaging optical system, are formed at corrected aperture locations on the tracing plate 32, when an aperture plate 43 is made according to the tracing plate 32, the location error caused by the optical system are corrected when the dot images are projected in the normal, forward direction.

The aperture plate 43 manufactured by the second embodiment cancels the location error of the dot images due to distortion caused by optical and mechanical errors by forming an aperture plate 43 that takes into account the error of the imaging optical system. When this aperture plate 43 is used, since the dot images on the film 3 are formed in accurate locations, it allows an accurately drawn pattern to be formed. Accordingly, the aperture plate 43 manufactured by the second embodiment has a high accuracy for forming the dot image pattern on the film 3, similar to the method of the first embodiment.

Figures 9A, 9B:
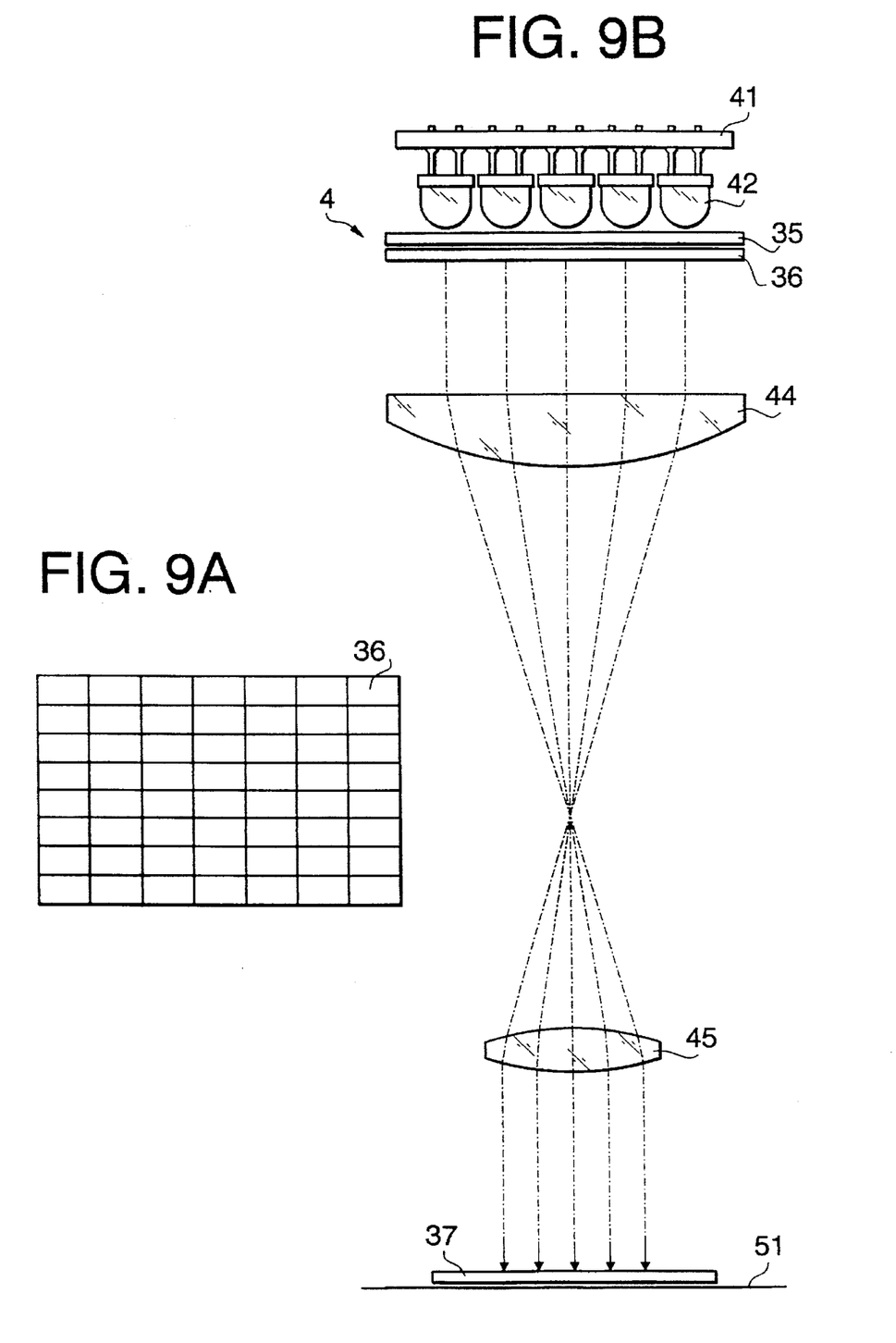
FIG. 9A shows a grid pattern plate of a third embodiment of a method of making the aperture plate.
FIG. 9B shows the third embodiment of a method of making the aperture plate.

In a third embodiment of a method according to the invention, a reference grid pattern plate 36, as shown in FIG. 9A, is placed at the second position, as shown in FIG. 9B, and is used to generate a guide image at the first position, the same position as the position of the aperture plate 43 as shown in FIG. 2.

As shown in FIG. 9B, the reference grid pattern plate 36 is arranged at the position of the aperture plate 43 as shown in FIG. 2. The reference grid pattern plate 36 is then illuminated through a diffuser 35 by all of the LED's 42 to form a grid guide image on a photosensitive material 37 arranged at the image surface 51. In general, due to the distortion of the imaging optical system, the projected grid guide image on a photosensitive material 37 at the image surface 51 is distorted when compared with the reference grid pattern 36 shown in FIG. 9A. The distortion of the imaging optical system is detected by measuring the location error of the crossing points of the grid guide image from the ideal location pattern. The corrected aperture location of each aperture 43A of the aperture plate 43 is determined based on the result of this location error measurement, so as to cancel the effect of the distortion.

In the third embodiment of a method according to the invention, although a reference grid pattern plate 36 is used to detect the location error of the projected pattern when compared to the ideal location pattern, any pattern that allows such comparison and detection may be used without departing from the scope or spirit of the invention.

The present disclosure relates to subject matter contained in Japanese Patent Application No. HEI 07-142746, filed on May 17, 1995, which is expressly incorporated herein by reference in its entirety.

What is claimed is:

1. A method for forming an aperture plate for use in a pattern drawing device in which dot images of light transmitted through apertures in the aperture plate are formed on an image surface in a forward direction through an imaging optical system, said method comprising:

arranging a master chart at a first position corresponding to a position of the image surface, said master chart having a pattern of master dot markings that correspond to ideal dot image locations;

illuminating said master chart to form guide images of said master dot markings in a reverse direction through said imaging optical system, at a second position corresponding to a position of the aperture plate;

recording said guide images of said master dot markings; and forming corrected apertures in the aperture plate at locations of said guide images of said master dot markings, said corrected apertures forming dot images at said ideal dot image locations when light is transmitted through said corrected apertures from said second position through said imaging optical system in said forward direction to said first position.

2. The method according to claim 1, wherein said recording comprises:

arranging a photosensitive material at said second position; and copying said guide images of said master dot markings onto said photosensitive material.

3. The method according to claim 1, wherein said master chart includes master dot markings corresponding to every corrected aperture to be formed in said aperture plate.

4. A method for forming an aperture plate for use in a pattern drawing device in which dot images of light transmitted through apertures in the aperture plate are formed on an image surface in a forward direction through an imaging optical system, said method comprising:

arranging a single master dot marking at a first position corresponding to a position of the image surface;

illuminating said single master dot marking to form a guide image of said single master dot marking in a reverse direction through said imaging optical system, at a second position corresponding to a position of the aperture plate;

recording said guide image of said single master dot marking;

changing a relative position between said single master dot marking and the imaging optical system, the amount of the relative position change being calculated from a locational relationship between ideal dot image locations;

repeating said recording and said changing until guide images of said single master dot marking are recorded for ideal dot image locations corresponding to a predetermined pattern; and forming corrected apertures in the aperture plate at recorded locations of said guide images of said single master dot marking, said corrected apertures forming dot images at said ideal dot image locations when light is transmitted through said corrected apertures from said second position through said imaging optical system in said forward direction to said first position.

5. A method for forming an aperture plate for use in a pattern drawing device in which dot images of light transmitted through apertures in the aperture plate are formed on an image surface in a forward direction through an imaging optical system, said method comprising:

arranging a master chart at a first position corresponding to a position of the image surface, said master chart having a pattern that corresponds to a locationally correct image;

illuminating said master chart to form a guide image in a reverse direction through said imaging optical system, at a second position corresponding to a position of the aperture plate;

recording said guide image; and forming corrected apertures in the aperture plate at locations determined by said guide image, said corrected apertures forming locationally correct dot images when light is transmitted through said corrected apertures from said second position through said imaging optical system in said forward direction to said first position.

6. The method according to claim 5, wherein said pattern corresponding to said locationally correct image includes master dot markings that corresponds to ideal dot image locations, and wherein said corrected apertures are formed in the aperture plate at locations in said guide image of images of said master dot markings.

7. The method according to claim 5, wherein said pattern corresponding to said locationally correct image includes at least one master dot marking movable to ideal dot image locations, and wherein said corrected apertures are formed in the aperture plate at locations in said guide images of a plurality of images of said at least one master dot marking, each of said plurality of images of said at least one master dot marking corresponding to an ideal dot image location.

8. A method for forming an aperture plate for use in a pattern drawing device in which dot images of light transmitted through apertures in the aperture plate are formed on an image surface in a forward direction through an imaging optical system, said method comprising:

arranging a reference grid pattern at a second position corresponding to a position of the aperture plate;

illuminating said reference grid pattern to form a grid guide image in said forward direction through said imaging optical system, at a first position corresponding to a position of the image surface;

recording said grid guide image; and forming corrected apertures in the aperture plate at locations determined by said grid guide image by comparing said reference grid pattern and said grid guide image to determine said corrected aperture locations, said corrected apertures forming locationally correct dot images when light is transmitted through said corrected apertures from said second position through said imaging optical system in said forward direction to said first position.

* * * * *